(12) United States Patent
Wang et al.

(10) Patent No.: US 6,583,641 B2
(45) Date of Patent: Jun. 24, 2003

(54) METHOD OF DETERMINING INTEGRITY OF A GATE DIELECTRIC

(75) Inventors: Mu-Chun Wang, Hsinchu Hsien (TW); Shih-Chieh Kao, Hsinchu (TW); Yu-Yiu Lin, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 65 days.

(21) Appl. No.: 09/842,039

(22) Filed: Apr. 25, 2001

(65) Prior Publication Data

US 2002/0158648 A1 Oct. 31, 2002

(51) Int. Cl.$^7$ ............................................. G01R 31/02
(52) U.S. Cl. ...................................... 324/765; 324/766
(58) Field of Search ............................... 324/763, 765, 324/766, 769, 73.1, 158.1; 438/14, 17, 18

(56) References Cited

U.S. PATENT DOCUMENTS

| | | | | |
|---|---|---|---|---|
| 3,888,918 A | * | 6/1975 | Trindade | 324/769 |
| 4,382,229 A | * | 5/1983 | Cottrell et al. | 324/765 |
| 5,615,377 A | * | 3/1997 | Shimizu et al. | 703/13 |
| 6,188,234 B1 | * | 2/2001 | Abadeer et al. | 324/766 |
| 6,249,139 B1 | * | 6/2001 | Fu et al. | 324/766 |

\* cited by examiner

Primary Examiner—Vinh P. Nguyen
(74) Attorney, Agent, or Firm—J.C. Patents

(57) ABSTRACT

A gate dielectric breakdown test method is disclosed. The method includes performing a one step programmed VRDB test using Vcc voltage power source, gate current density for the corresponding ramped voltages are recorded. If the gate current density is found to be higher than a specified gate current density criterion, then the gate oxide is deemed to defective and is scrapped. And, if the gate current density (Jg) is found to be less than the specified gate current density criterion (Jc), then a differential gate current density ratio R=ΔJg/Jg for the corresponding ramped voltages are calculated. If the R value is found to be less than a specified differential current density ratio criterion (Rc), then the gate dielectric is considered to be robust, and if the R value is greater than the Rc value, then the gate dielectric is considered to be inflected. Accordingly, the voltage Vg can be effectively used for justifying the integrity of the gate dielectric.

15 Claims, 2 Drawing Sheets

METHOD OF DETERMINING INTEGRITY OF A GATE DIELECTRIC

BACKGROUND OF THE INVENTION

1. Filed of Invention

The present invention relates generally to semiconductor and more specifically to a gate dielectric breakdown test method.

2. Description of Related Art

Dielectric breakdown is one of the main reliability concerns in Ultra Large Scale Integration (ULSI) semiconductor devices. In other words, the longer the life-time of the dielectric integrity, the better the reliability of the semiconductor device. Dielectric breakdown is generally believed to be caused by the positive charge build-up in the oxide near the injecting, cathode interface. In oxide thickness greater than 120 Å, the source of these positive charges is traditionally believed to be due to impact ionization deep within the oxide caused by the tunneling electrons. Initially, the tunneling currents are extremely low. Positive charges drift back toward the cathode and are believed to be trapped at localized weak spots. These trapped positive charges lower the energy band and lead to further electron injection. The process leads to further impact ionization and positive charge trapping, resulting in a runaway process. The final high current I injected at localized spots at positive-trapping sites produces an $I^2 R$ heating sufficient to melt the $SiO_2$. Before the catastrophic oxide rupture, oxide becomes leaky, and the leakage currents could cause circuits to be nonfunctional.

One method for determining dielectric reliability is based on an accelerated life-time stress conditions such as high gate voltage to accelerate the mechanism of breakdown from many years, under normal operating conditions, to seconds. The higher the gate voltage, the lower is time-to-breakdown. This method is well known in the art and it is called voltage ramping dielectric breakdown (VRDB) test method. The gate voltage has the strongest effect in accelerating the breakdown mechanism. However, one problem with this test method is it can offer a reliable result for dielectric structure of thickness more than 5 m, where a hard breakdown can be easily detected. But for ultra-thin gate dielectrics, below about 5 nm, the relationship between breakdown voltage and applied voltage is linear (on a logarithmic time, linear voltage scale) up to an upper limit of gate voltage, beyond which the relationship is non-linear.

This relationship is shown in FIG. 1 for a 4.5 nm oxide. To make accurate projections of the time-to-breakdown it is highly desirable to keep the accelerated stress voltage in the range where the relationship between voltage and time-to-breakdown is linear on a logarithmic scale. In FIG. 1, the breakdown deviates from a linear relationship with the gate voltage at approximately 5.8 volts. This deviation puts an upper limit on the stress voltage and, therefore, a lower limit on the time required to reach breakdown.

The problem with this conventional procedure is that the only variable available in stressing the semiconductor device is the gate voltage. The gate voltage directly determines the magnitude of gate current and the gate current (or the injected charge) has a major effect on the process of dielectric degradation leading to breakdown. A higher gate current (or injected charge) requires a lower time-to-breakdown. The problem with this stress procedure is that the gate current is not controlled independently, but rather is dictated by the applied gate voltage. Thus, the required stress time cannot be decreased below a certain time limit without compromising the accuracy of the reliability projections. It will be understood by those skilled in the art that when measuring the integrity of a gate dielectric with thickness down to 16 Å, the problems would be even more serious.

FIG. 2, shows a typical schematic of a gate dielectric breakdown VRDB test method, an n-type field effect transistor or NFET 120 comprises a substrate 100 having a diffused source region 104, a diffused drain region 106, and a gate oxide region or dielectric 102. Overlying the gate oxide region is a gate electrode 110. The gate electrode 110 is connected to a +Vg potential reference; the drain region 106 is connected to a Vd potential reference; the source region 104 is connected to a Vs potential reference; and the substrate 100 is connected to a Vsub potential reference. V.sub.S, V.sub.D and V.sub.SUB are at ground potential. In this conventional system, only Vg controls the gate dielectric voltage and the amount of current injected into the gate (with the channel inverted and source and drain grounded). Because only Vg controls the gate electric field and the gate current Jg, high values of Vg are required to reach dielectric breakdown in a reasonable time.

In a method disclosed in U.S. Pat. No. 4,382,229, issued May 3, 1983, Cottrell et al. teach that, when gate electrode 110 is biased above the threshold voltage of the NEET 120 and Vd is biased above the source voltage Vs, a channel is created between the source 104 and drain 106 and electrons flow through the channel from the source 104 to the drain 106. Electrons flowing from the source 104 to the drain 106 are "heated" by the high electric field near the drain 106, and a small fraction attain enough energy to surmount the energy barrier at the oxide-silicon interface and pass into the silicon oxide layer. The fraction of electrons which is emitted depends strongly on the electric field near the drain 106 and thus on the bias conditions and the device structure.

Cottrell et al. further teach that, by measuring the rate of change in gate current, the time required to achieve a predetermined change in source-to-drain current may be found. The problem with the Cottrell et al. method is that the emission current into the gate is small and applying the method to determine the time-to-breakdown of the dielectric is quite limited. Cottrell et al. teach a method for evaluating channel hot carriers in an FET, and do not address evaluation of dielectric breakdown in an FET.

In another disclosure, U.S. Pat. No. 5,615,377 issued Mar. 25, 1997 to Shimizu et al., a method of simulating hot carrier deterioration of a p-type metal-oxide semiconductor (PMOS) FET is taught. Shimitzu et al. provide a method by which a PMOS FET is forward and reverse biased. By measuring the characteristics of the PMOS FET and applying them in a simulation, Shimizu et al. estimate the deterioration of the transistor. Their teachings are limited: the method applies only to a PMOS FET and does not teach how to measure the time-to-breakdown of a PMOS FET or an NMOS FET.

In yet another disclosure, U.K. Patent Application No. 2,296,778 A, published on Oct. 7, 1996, there is disclosed a method for testing the reliability of a dielectric film on a semiconductor substrate. The method applies a gate current which is increased in successive steps until the dielectric film breaks down. A disadvantage of this method is that, in order to increase the gate current, the gate voltage must also be increased. Gate current cannot be independently controlled from gate voltage.

The method also does not work in ultra-thin dielectrics, because a very high stress field must be applied until breakdown occurs. Applying a high electric field to the gate results in inaccuracies in determining the dielectric reliability. At high electric fields the relationship between applied gate voltage and the time-to-breakdown is non-linear on a logarithmic scale, thereby causing errors in extrapolating the results to determine the time-to-breakdown.

Another method is taught by H. Ning et al. in Journal of Applied Physics, Volume 48, page 286 (1977). A negative, or reverse bias is applied to Vsub and a positive, or forward bias, is applied to Vg with Vs and Vd both at a ground potential (refer to FIG. 3). A tungsten light bulb (not shown) supplies photons into the gate electrode 20 and gate dielectric 102, which in turn generates electron-hole pairs in substrate 14. The electrons gain energy from the electric field, as they drift toward the interface between the substrate 100 (silicon) and the gate dielectric 102 (silicon dioxide). The electrons arriving at the interface with sufficient energy are emitted into the gate dielectric 102. These emitted electrons are collected as the gate current. The method taught by H. Ning et al. requires two reference voltages, Vg and Vsub, as well as a light energy source. Vg and Vsub cannot supply enough electrons into the gate, however, because Vg and Vsub are kept at low reference potentials. Furthermore, this method is not feasible for integrated processing applications where the semiconductor is covered by back-end-of-line (BEOL) dielectrics and metals.

The deficiencies of the conventional methods show that a need still exists for an effective and reliable method to measure the dielectric breakdown voltage. To overcome the shortcomings of the conventional methods, the present invention provides a highly effective and reliable dielectric breakdown test method which amplifies the sensitivity beyond the upper gate voltage limit. Another object of the present invention is to provide a method which can accurately determine the reliability of the gate dielectric in a short amount of time.

SUMMARY OF THE INVENTION

The present invention provides a highly effective and reliable dielectric breakdown test method.

The present invention provides a highly effective and reliable dielectric breakdown test method which substantially amplifies the sensitivity of the VRDB test beyond the upper voltage limit so that it is possible to detect the gate dielectric breakdown accurately.

The present invention provides a highly accurate and reliable dielectric breakdown test method which can determine the integrity of the gate dielectric with thickness as thin as up-to 16 Å.

The present invention provides a highly accurate and reliable dielectric breakdown test method which can determine the integrity of the gate dielectric without utilizing a great amount of time to reach the dielectric breakdown.

The present invention provides a highly accurate and reliable dielectric breakdown test method which can determine the integrity of the gate dielectric so that the reliability or the quality of the semiconductor devices can be controlled and assured.

To achieve these and other objects, and in view of its purposes, the present invention is directed to a method of determining the integrity of a gate dielectric in a MOS transistor. The method includes performing a one step programmed VRDB test using a Vcc voltage power source, gate current density for the corresponding ramped voltages Vg are recorded. Next, the gate current density Jg at an operating Vcc voltage Vg is determined. If the gate current density Jg at the operating Vcc voltage Vg is found to be higher than a specified gate current density criterion, then the gate dielectric is deemed to be defective and is scrapped. And, if the gate current density (Jg) is found to be less than the specified gate current density criterion, then a differential current density ratio $R=\Delta Jg/Jg$ is calculated. If the R value is found to be less than a specified R criterion, then the gate dielectric is considered to be robust, and if the R value is greater than the specified R criterion, then the gate dielectric is considered to be inflected. Accordingly, the voltage Vg can be effectively used to justify the integrity of the gate dielectric.

It is to be understood by those skilled in the art that the present invention provides a simple and reliable gate oxide breakdown test method by first determining the gate current density at a Vcc operating voltage for screening the defective gate dielectric and then calculating the differential current density ratio for those gate dielectric that have passed the screening test in order to detect the gate dielectric breakdown voltage accurately.

It is to be further understood by those skilled in the art that because the test parameters are accurately measurable, therefore the gate dielectric breakdown voltage can be accurately determined.

It is to be further understood by those skilled in the art that because the gate dielectric breakdown voltage can be accurately determined, only a small portion of the gate dielectric can therefore justify the entire gate dielectric integrity. Thus it not necessary to perform a cumulative test for the entire gate dielectric area. Therefore the testing time can be substantially reduced.

It is to be understood by those skilled in the art that because a differential current density ratio measurement is used for determining the gate dielectric breakdown, therefore the sensitivity of the VRDB test beyond the upper gate voltage limit can be amplified so that it is possible to accurately detect the gate dielectric breakdown overcoming the voltage/current and time limiting factors.

It is to be understood by those skilled in the art that because the sensitivity of the VRDB test method is substantially amplified by utilizing the differential current density ratio measurement, therefore the integrity of gate dielectric with thickness up to 16 Å can be measurable accurately.

It is to be understood by those skilled in the art that because the present invention provides a screening test, and then a step of determining the gate dielectric integrity by using a specified differential current density ratio criterion to justify the integrity of the gate dielectric, it is therefore not necessary to run the voltage ramping test until the gate dielectric breakdown, therefore the time consumed during the test can be further reduced, thus the through-put can be substantially increased.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DESCRIPTION OF THE PREFERRED EMBODIMENTS

Figure 1:
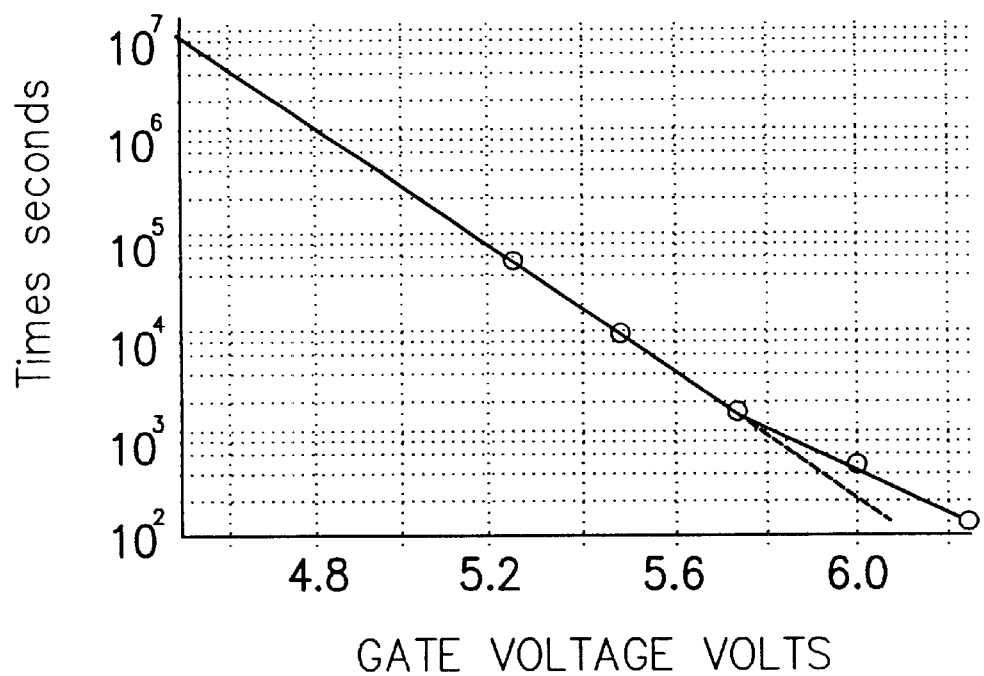
FIG. 1 is a logarithmic plot showing the gate dielectric time-to-breakdown as a function of the gate voltage of a NFET transistor.

Reference will be made in detail to the present preferred embodiments of the invention, examples of which are illustrated in the accompanying drawings. Wherever possible, the same reference numbers are used in the drawings and the description to refer to the same or like parts.

It is to be understood that the foregoing general description and the following detailed description are exemplary, and are intended to provide further explanation of the invention as claimed.

Ultra-thin gate dielectric breakdown is one of the main reliability concerns in ultra large scale integration (ULSI) semiconductor devices. Determining the dielectric breakdown requires a method of using accelerated life-time stressing on these devices. As will be explained, the test method is independent of the voltage/current and time limit factors.

Figure 2:
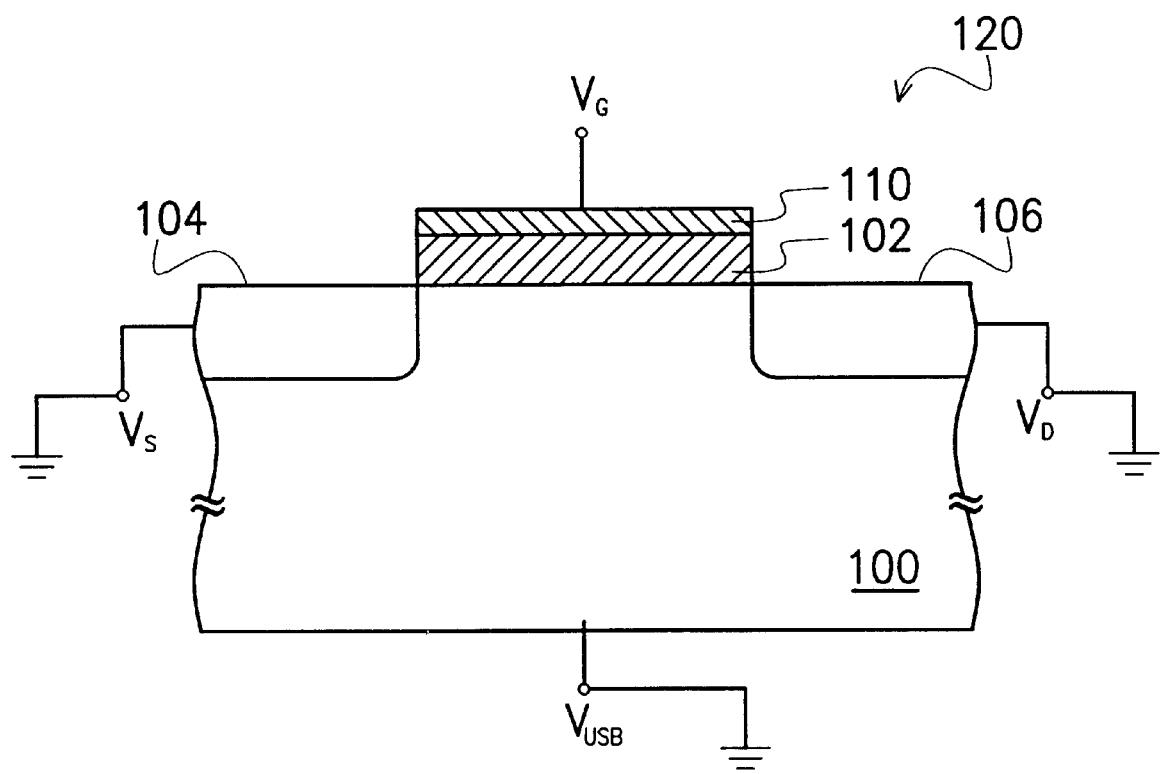
FIG. 2 shows schematically an NFET transistor biased in accordance with a preferred embodiment of the present invention.

Referring to FIG. 2, shows a typical schematic of a gate dielectric breakdown VRDB test method, an n-type field effect transistor or NFET 120 comprises a substrate 100 having a diffused source region 104, a diffused drain region 106, and a gate oxide region or dielectric 102. Overlying the gate oxide region is a gate electrode 110. The gate electrode 110 is connected to a +Vg potential reference; the drain region 106 is connected to a Vd potential reference; the source region 104 is connected to a Vs potential reference; and the substrate 100 is connected to a Vsub potential reference. Vs, Vd and Vsub are at ground potential. In this scheme, only Vg controls the gate dielectric voltage and the amount of current injected into the gate (with the channel inverted and source and drain grounded).

Figure 3:
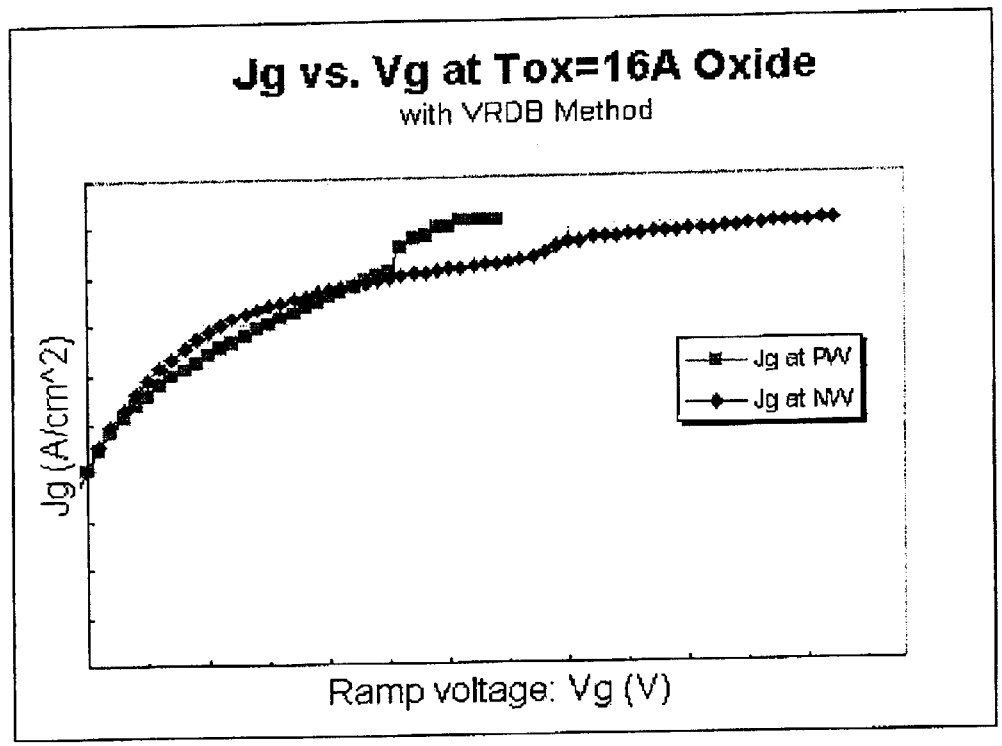
FIG. 3 is a logarithmic plot showing gate current density Jg at successive ramp voltage Vg using a gate dielectric thickness of about 16 Å, in accordance with a preferred embodiment of the present invention.

The present invention is directed to a method of determining breakdown voltage of a gate dielectric 102 in a MOS transistor. The method includes performing a one step programmed VRDB test using Vcc voltage power source, gate current density Jg for the corresponding ramped voltages Vg are recorded. For example the applied Vcc voltage Vg range is preferably between 0 to 10 volts. For example, the duration of said VRDB test is about 5 seconds. FIG. 3 is a logarithmic plot showing gate current density Jg at successive ramp voltage Vg in accordance with a preferred embodiment of the present invention. Wherein Jg at PW indicate successive gate current density Jg (A/cm$^2$) at ramped voltage Vg (volt) for gate oxide on p-well with thickness of 16 Å. Similarly Jg at NW indicate successive gate current density Jg (A/cm$^2$) at ramped voltage Vg (volt) for gate oxide on n-well with thickness of 16 Å.

Next, a screening step is performed. In the screening step, the gate current density Jg at a Vcc operating voltage Vg is determined. Preferably, the Vcc operating voltage Vg is the actual operating voltage of a particular semiconductor device that contains the tested MOS transistors. If this gate current density Jg value is found to be higher than a specified gate current density criterion (Jc), for example Jg>0.1 A/cm$^2$, then the gate dielectric 102 is deemed to defective and is scrapped. And, if the gate current density Jg is found to be less than the specified gate current density criterion (Jc), then a step of determining the gate dielectric 102 integrity is carried out.

Figure 4:
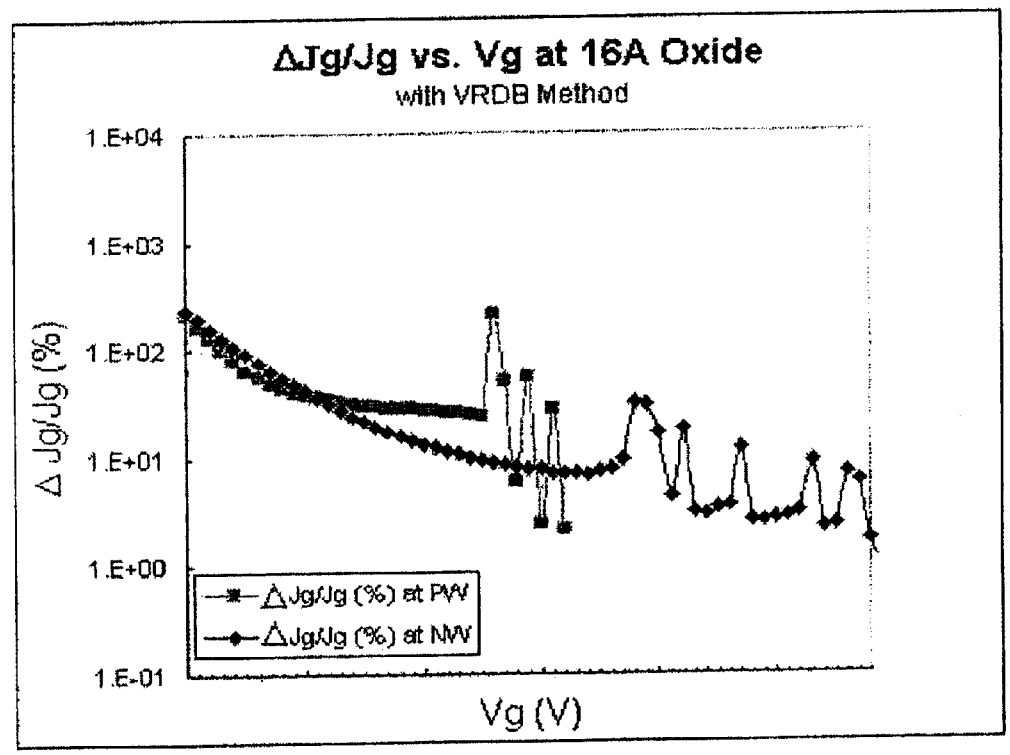
FIG. 4 is plot showing the differential current density ratio R=ΔJg/Jg % vs. voltage Vg in accordance with preferred embodiment of the present invention.

Next, in the step of determining the gate dielectric 102 integrity include calculating a differential current density ratio $R(Vg_i)=\Delta Jg_i/Jg_i$ %, wherein $\Delta Jg_i=Jg_i-Jg_{i-1}$, $Jg_i$=gate current density at a ramped voltage $Vg_i$, and $Jg_{i-1}$=gate current density of one immediate neighbor of $Jg_i$, where $Jg_{i-1}<Jg_i$. If the R value is found to be less than a specified differential current density ratio criterion (Rc), for example, 2, then the gate dielectric 102 is considered to be robust, and if the R value is equal to or greater than the Rc value, then the gate dielectric 102 is considered to be inflected. The voltage Vg at which the gate dielectric 102 is inflected is said to be the gate dielectric breakdown voltage. Accordingly, the voltage Vg can be effectively used to justify the integrity of the gate dielectric 102. FIG. 4 is a plot showing the differential current density ratio R=ΔJg/Jg % vs. voltage Vg (volt) in accordance with preferred embodiment of the present invention.

Therefore the claimed test method makes it possible to substantially amplify the sensitivity of the VRDB test beyond the upper gate voltage limit so that the gate dielectric breakdown can be accurately detected and determined. Because the sensitivity of the VRDB test method can be substantially amplified by using the differential current density ratio R=ΔJg/Jg % measurement, a gate dielectric with thickness as thin as up to 16 Å can be measurable accurately. Thus the quality and the reliability of the semiconductor devices can be well controlled and assured.

It is to be understood by those skilled in the art that the present invention provides a simple and reliable gate dielectric breakdown test method by first determining the gate current density at a Vcc operating voltage for screening the defective gate dielectric and then calculating the differential current density ratio R for those gate dielectric that have passed the screening test in order to determine the gate dielectric integrity accurately.

It is to be further understood by those skilled in the art that because the test parameters are accurately measurable, therefore the gate dielectric integrity can be accurately determined. Therefore the reliability and the quality of the semiconductor devices can be well controlled and assured.

It is to be further understood by those skilled in the art that because the gate dielectric breakdown voltage can be accurately determined, only a small portion of the gate dielectric can therefore justify the entire gate dielectric integrity. Thus it not necessary to perform a cumulative test for the entire gate dielectric area. Therefore the testing time can be substantially reduced.

It is to be understood by those skilled in the art that because the present invention provides a screening test, and then a step of determining the gate dielectric integrity by using a specified differential current density ratio criterion to justify the integrity of the gate dielectric, it is therefore not necessary to run the voltage ramping test until the gate dielectric breakdown, therefore the time consumed during the test can be further reduced, thus the through-put can be substantially increased.

It is to be understood by those skilled in the art that because a differential current density ratio is used for determining the gate dielectric breakdown, therefore the sensitivity of the VRDB test beyond the upper gate voltage limit can be amplified so that it is possible to accurately detect the gate dielectric breakdown overcoming the voltage/current and time limiting factors.

It is to be understood by those skilled in the art that because the sensitivity of the VRDB test method is substantially amplified by utilizing the differential current density ratio R=ΔJg/Jg % measurement, therefore the integrity of gate dielectric with thickness up to 16 Å can be measurable accurately.

It is to be understood by those skilled in the art that because it is not necessary to run the voltage ramping test until the gate dielectric breakdown, therefore the time consumed during the test can be further reduced, thus the through-put can be substantially increased.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method of determining an integrity of a gate dielectric in a MOS transistor, the method comprising the steps of:

performing a programmed voltage ramping step, wherein a ramping voltage Vg is applied to a gate of the MOS transistor;

performing a screening step to detect a defective gate dielectric, wherein a relative gate current density at an operating Vcc voltage is determined;

if the relative gate current density is found to be higher than a specified gate current density criterion, the gate dielectric is deemed to defective; and if the relative gate current density is found to be less than the specified gate current density criterion, determining the integrity of the gate dielectric.

2. The method according to claim 1, wherein the voltage ramping range is between 0 to 10 volts.

3. The method according to claim 1, wherein the duration of the voltage ramping step is 5 seconds.

4. The method according to claim 1, wherein during the voltage ramping step, relative gate current density ($J_i$) at a successive ramped voltage are measured and recorded.

5. The method according to claim 1, wherein the operating Vcc voltage means an actual operating voltage of a particular semiconductor device that contains the MOS transistor.

6. The method according to claim 1, wherein the screening step including scrapping the gate dielectric which fail to meet the specified gate current density criterion.

7. The method according to claim 1, wherein the step of determining the integrity of the gate dielectric include calculating the differential gate current density ratio (R) and plotting a "differential gate current density ratio (R) vs. voltage (Vg) graph" to determine the integrity of the gate dielectric, wherein $R(Vg_i)=\Delta Jg_i/Jg_i$, wherein $\Delta Jg_i=Jg_i-Jg_{i-1}$, and $Jg_{i-1}<Jg_i$.

8. The method according to claim 1, wherein the step of determining the integrity of the gate dielectric include determining the voltage at which the differential gate current ratio (R) is lower than or equal to or greater than a specified differential gate current density ratio criterion (Rc), wherein if the R value is found to be equal or greater than the specified Rc criterion, then the gate dielectric is deemed to be inflected and if the R value is less than the Rc criterion, then the gate dielectric is deemed to be robust.

9. A method of determining an integrity of a gate dielectric in a MOS transistor, the method comprising the steps of:

performing a programmed voltage ramping step, wherein a ramping voltage Vg is applied to a gate of the MOS transistor;

performing a screening step to detect a defective gate dielectric, wherein a relative gate current density at an operating Vcc voltage is determined;

if the relative gate current density is found to be higher than a specified gate current density criterion, the gate dielectric is deemed to defective; and if the relative gate current density is found to be less than the specified gate current density criterion, determining the integrity of the gate dielectric, wherein differential gate current density ratios (R) are calculated, and a "differential gate current density ratio (R) vs. voltage (Vg) graph" is plotted to determine the integrity of the gate dielectric, wherein $R(Vg_i)=\Delta Jg_i/Jg_i$, wherein $\Delta Jg_i=Jg_i-Jg_{i-1}$, and $Jg_{i-1}<Jg_i$.

10. The method according to claim 9, wherein the voltage ramping range is from 0 to 10 volts.

11. The method according to claim 9, wherein the duration of the voltage ramping step is 5 seconds.

12. The method according to claim 9, wherein during the voltage ramping step, relative gate current density ($J_i$) at a successive ramped voltage are measured and recorded.

13. The method according to claim 9, wherein the operating Vcc voltage means an actual operating voltage of a particular semiconductor device that contains the MOS transistor.

14. The method according to claim 9, wherein the screening step including scrapping the gate dielectric which fail to meet the specified gate current density criterion.

15. The method according to claim 9, wherein the step of determining the integrity of the gate dielectric include determining the voltage at which the differential gate current ratio (R) is lower than or equal to or greater than a specified differential gate current density ratio criterion (Rc), wherein if the R value is found to be equal or greater than the specified Rc criterion, then the gate dielectric is deemed to be inflected and if the R value is less than the Rc criterion, then the gate dielectric is deemed to be robust.

* * * * *